(12) United States Patent
Oide et al.

(10) Patent No.: US 8,061,876 B2
(45) Date of Patent: Nov. 22, 2011

(54) ILLUMINATION DEVICE

(75) Inventors: Ken Oide, Tokyo (JP); Tsuyoshi Sawamoto, Tokyo (JP); Hideyuki Ikeda, Tokyo (JP); Shunji Ishii, Tokyo (JP)

(73) Assignee: The Furukawa Electric Co., Ltd, Tokyo (JP)

( * ) Notice: Subject to any disclaimer, the term of this patent is extended or adjusted under 35 U.S.C. 154(b) by 295 days.

(21) Appl. No.: 12/377,797

(22) PCT Filed: Aug. 24, 2007

(86) PCT No.: PCT/JP2007/066463
§ 371 (c)(1),
(2), (4) Date: Feb. 17, 2009

(87) PCT Pub. No.: WO2008/023797
PCT Pub. Date: Feb. 28, 2008

(65) Prior Publication Data
US 2010/0284190 A1 Nov. 11, 2010

(30) Foreign Application Priority Data

Aug. 25, 2006 (JP) ................................. 2006-229239
Mar. 20, 2007 (JP) ................................. 2007-072982

(51) Int. Cl.
*F21V 11/16* (2006.01)
(52) U.S. Cl. ........ 362/297; 362/298; 362/300; 362/301; 362/311.02; 362/290; 362/292; 362/342; 362/241
(58) Field of Classification Search ............... 362/231, 362/235–238, 240–241, 244, 246, 243, 245, 362/247, 248, 307, 308, 309, 311.02, 97.3, 362/327–328, 290, 292, 342, 300, 297; 257/98, 257/100; 313/500, 512; 349/69
See application file for complete search history.

(56) References Cited

U.S. PATENT DOCUMENTS

| | | | | |
|---|---|---|---|---|
| 4,935,665 A * | 6/1990 | Murata | ......................... | 313/500 |
| 5,836,676 A * | 11/1998 | Ando et al. | ................... | 362/244 |
| 6,566,824 B2 * | 5/2003 | Panagotacos et al. | ........ | 315/291 |
| 7,312,927 B2 * | 12/2007 | Bogner et al. | ................ | 359/630 |
| 2007/0115671 A1 * | 5/2007 | Roberts et al. | ................ | 362/367 |

FOREIGN PATENT DOCUMENTS

| | | |
|---|---|---|
| JP | 9-320311 A | 12/1997 |
| JP | 1083148 | 3/1998 |
| JP | 2002222994 | 8/2002 |
| JP | 2003-100117 A | 4/2003 |
| JP | 2004-87461 A | 3/2004 |
| JP | 2005-327577 A | 11/2005 |
| JP | 3787148 B1 | 6/2006 |
| WO | 2005067066 A1 | 7/2005 |

OTHER PUBLICATIONS

International Search Report dated Oct. 30, 2007 for PCT Application Serial No. PCT/JP2007/066463, 4 Pages.

* cited by examiner

*Primary Examiner* — Robert May
(74) *Attorney, Agent, or Firm* — Turocy & Watson, LLP

(57) ABSTRACT

An illumination device comprises a light reflecting plate, a circuit board, and a point like light source, the light reflecting plate or a combination of the light reflecting plate and the circuit board forming a receiving concave portion. The point like light source is arranged in the receiving concave portion, wherein a brightness of a light emitted from the point like light source is to be up to 30000 cd/m$^2$, when an incident angle of the light emitted from the light source is zero and 350 mm apart from the light source, and a part or all of the light emitted from the point like light source is reflected from an inner face of peripheral walls of the receiving concave portion and supplied as an illumination.

20 Claims, 8 Drawing Sheets

ILLUMINATION DEVICE

CROSS-REFERENCE TO RELATED APPLICATIONS

This application is a US national stage filing of Patent Cooperation Treaty (PCT) Application Serial No. PCT/JP2007/066463 (WO2008/023797), filed Aug. 24, 2007, which claims priority to Japanese Patent Application No. 2007-072982, filed Mar. 20, 2007 and Japanese Patent Application No. 2006-229239, filed Aug. 25, 2006, the entirety of each of which is incorporated herein by reference.

FIELD OF THE INVENTION

The present invention relates to an illumination device using a point like light source, in particular a LED (Light Emitting Device).

BACKGROUND OF THE INVENTION

A fluorescent light has been used as the illumination, in particular, the ceiling illumination in the government office, the company office and housing. As such the ceiling illumination, a reverse Mount Fuji type or embedded type of the ceiling illumination device using two 40 W straight tube-type of the fluorescent lights are generally used.

A so-called system ceiling is increasingly applied as the ceiling, where the ceiling is divided to about 600 mm×600 mm reticular patterns, for example. The ceiling portion, illumination portion, or outlet portion of the air conditioner is received in each of the reticular pattern. Consequently, variously created fluorescent lights are applied in the illumination device used in the ceiling (i.e., ceiling illumination device). For example, four pieces of 20 W straight tube-type fluorescent lights, each having the length of about 600 mm are used, and in addition, three pieces of 36 W compact type fluorescent lights are used.

Lately, there are proposed illumination devices using the LED as the light source, which has such excellent properties as long-life operation, high visibility & response, and wavelength selectivity. For example, an advertising display decorated with lights, a light box interiorly illuminated such as interiorly illuminated sign (refer to Patent document 1, for example) are exemplified.

In the LED used as the illumination, in general, the point like light generating portion is covered and molded into a bombshell shape by a sealing member such as transparent resin. The light from the light generating portion as the illumination is emitted with the narrow angle of about 50 degrees (refer to Patent document 2, for example).

Patent document 1: Japanese patent application publication No. Hei 10-83148
Patent document 2: Japanese patent application publication No. 2002-222994

DISCLOSURE OF THE INVENTION

Problem to be Solved

However, when the LED is merely used in place of the fluorescent light as the light source of the ceiling illumination, and it is tried to secure the same level of brightness by the LED as that of the fluorescent light, there is a problem in which the light is too glare to directly look up the ceiling illumination. Furthermore, when the light from the LED comes into the eyes while looking at the display of the personal computer in the room, there is a problem in which the light is too glare to continue to work.

The present invention is made in view of the above described problems. One of the objects of the invention is to provide the illumination device in which the intensity of the forward light of the point like light source is reduced to a level of no glare even if directly looked, and the light is irradiated to a necessary area while the light from the point like light source is scattered to the forward slanting direction or lateral direction without wasting the light.

In order to attain the above described object of the invention, the illustration device of the invention is an illumination device comprising a light reflecting plate, a circuit board, and a point like light source, the light reflecting plate or a combination of the light reflecting plate and the circuit board forming a receiving concave portion, the point like light source being arranged in the receiving concave portion, wherein a brightness of a light emitted from the point like light source is to be up to 30000 cd/m$^2$, when an incident angle of the light emitted from the light source is zero and 350 mm apart from the light source, and a part or all of the light emitted from the point like light source is reflected from an inner face of peripheral walls of the receiving concave portion and supplied as an illumination.

The point like light source preferably comprises an LED with a point like light generating portion sealed by a sealing member, and the sealing member is preferably equipped with a light diffusion means.

Although the shape of the sealing member is not limited to, but the sealing member preferably comprises the sealing member equipped with a bombshell like light diffusion, or a prism type or a concave lens type sealing member. Furthermore, separate prism or concave lens is preferably arranged in front of the LED.

The point like light source is preferably equipped with a light flux control member to scatter the light from the point like light source and emit same.

The point like light source preferably comprises a light source module including a LED mounted on a board sealed by a sealing member, and a light flux control member to scatter a light emitted from the LED and to emit same, arranged on a surface of the sealing member through which a light axis emitted from the LED is positioned.

The light source is preferably formed such that the light generated from the light generating portion is emitted through a light flux control member, or the light generated from the light generating portion is emitted through the sealing member and the light flux control member in this order, the light flux control member includes a light incident face into which the light from the light generating portion enters the light flux control member, and a light control emitting face to control the light emission from the light generating portion, concerning the light ranging between a direction to which at least maximum strength light is emitted from the LED and a direction to which one half of strength light of the maximum strength light is emitted, the light control emitting face is formed to satisfy a relation between θ1 and θ5 to be (θ5/θ1)>1 excluding the light in a vicinity of a reference plane, where the angle formed between the light entering the light flux control member and reaching the light control emitting face, and the line parallel to a reference light axis of the light source module and passing the reaching point is represented by the angle θ1, and an angle of the emission of the light from the light control emitting face is referred to as the angle θ5, and the light control emitting face is formed to be the shape in such fashion that a value of θ5/θ1 is gradually reduced as the θ1 increases.

The receiving concave portion is preferably formed to be a reverse multi sided pyramid or reverse multi sided pyramid with a top thereof cut, and the tops of peripheral walls of the receiving concave portion are connected each other to the tops of the peripheral walls of the adjacent receiving concave portion.

The scatter reflectivity of a visible light in the light reflecting plate is preferably at least 90%. The light reflecting plate preferably comprises a thermoplastic resin film or sheet which has fine foams or pores having an average diameter within the range from at least wavelength of the light to 50 μm inside thereof.

Effect of the Invention

According to the illumination device of the invention, since the light of the point like light source scatters not only to the front, but also forward slanting and lateral directions, the brightness of the light is reduced up to 30000 cd/m$^2$. Consequently, even if the light source is looked up from directly beneath, there is no too much glare. Furthermore, since the scattered light in the slanting and lateral directions are fully reflected from the wall face of the receiving concave portion, the light can be irradiated in wide area of the room to achieve excellent effect.

BEST MODE FOR CARRYING OUT THE INVENTION

Figure 1:
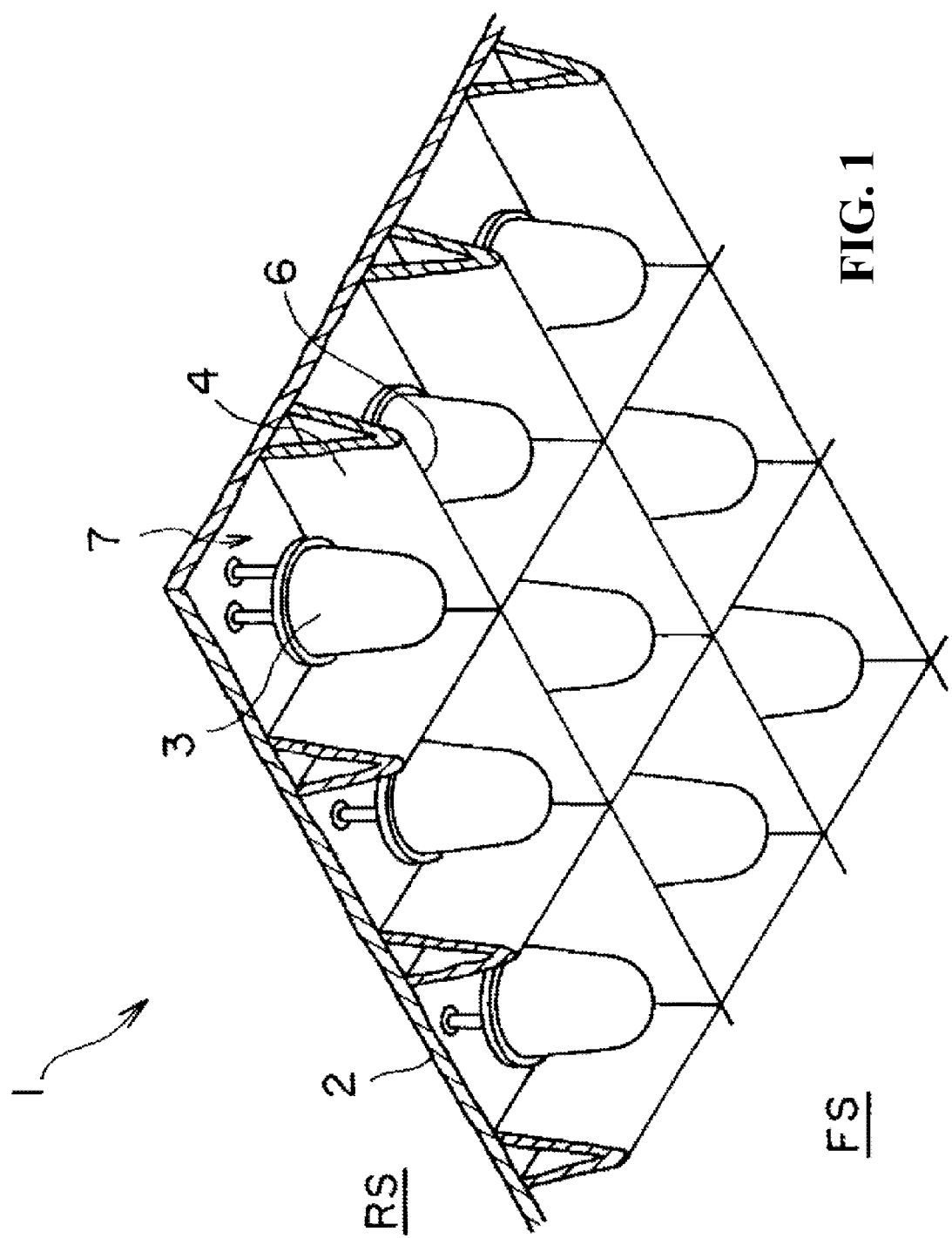
FIG. 1 is a partial perspective view of a main portion of the ceiling illumination device of one of the embodiment of the invention.
Figure 2:
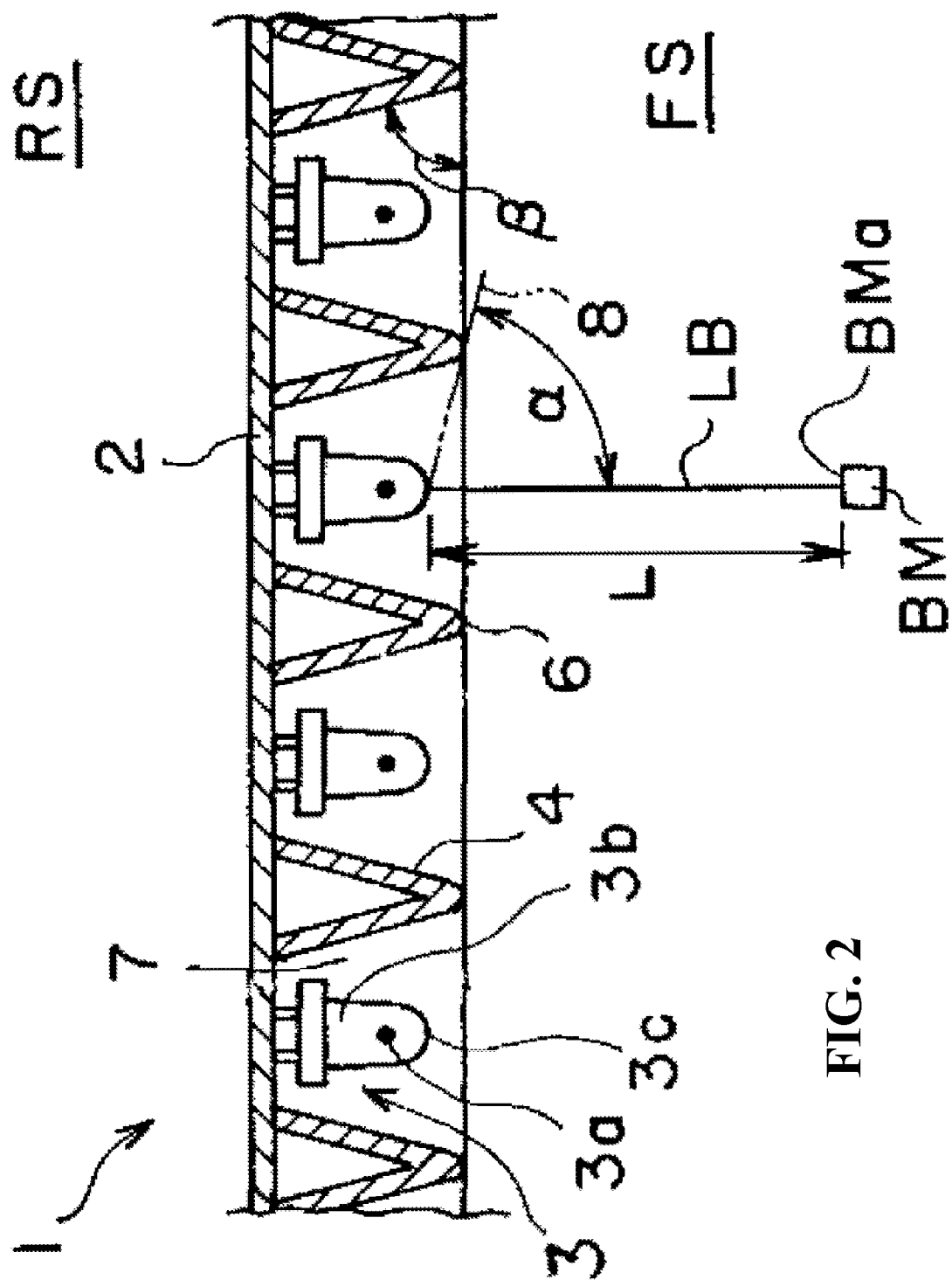
FIG. 2 is a cross sectional view of the main portion in FIG. 1.
Figure 3:
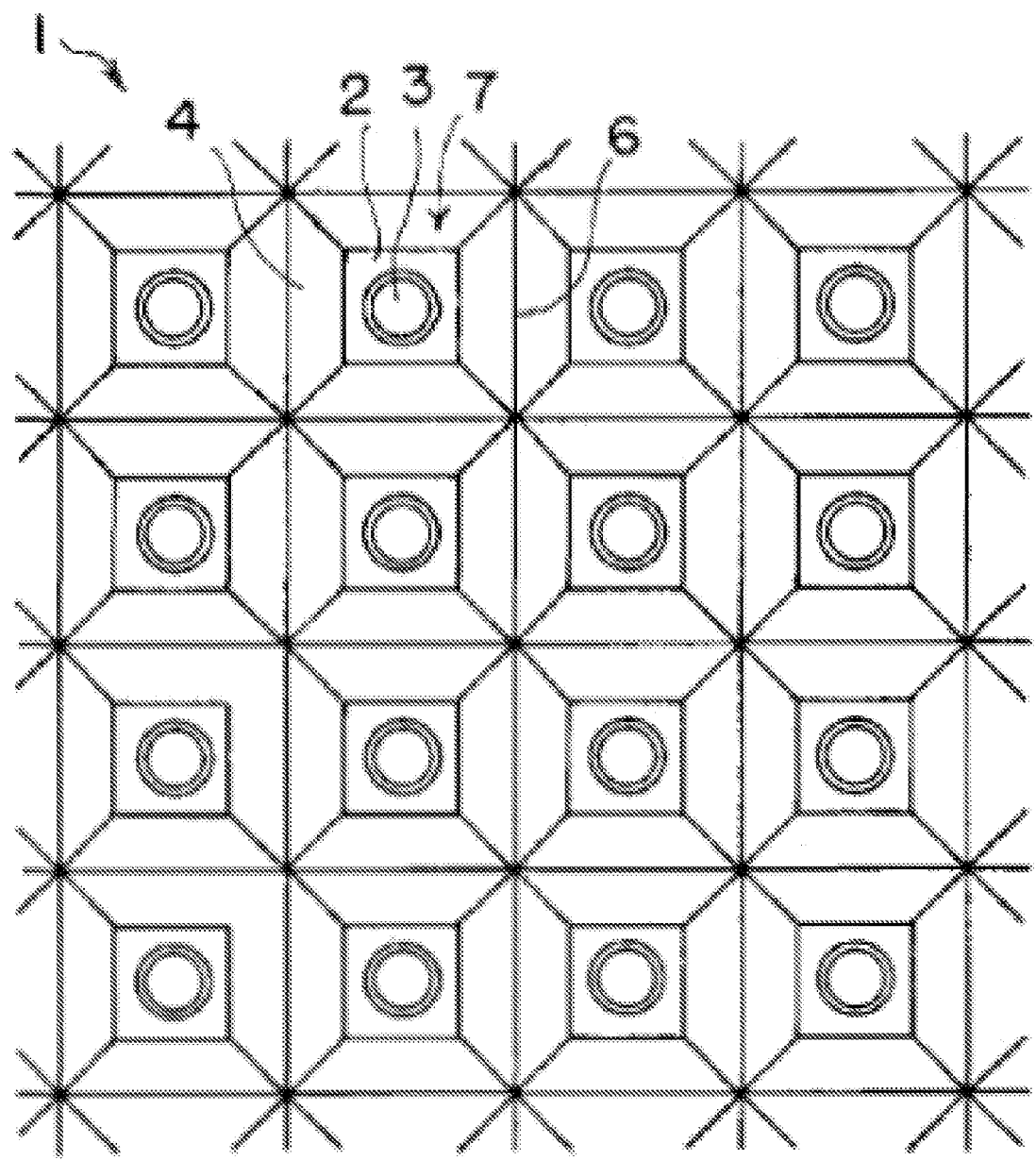
FIG. 3 is a partial front view of the main portion viewed from the direct underneath of the illumination device.

Embodiments of the present invention are described with reference to the drawings hereunder. FIGS. 1 to 3 depict one embodiment of the illumination device of the present invention. FIG. 1 is a partial perspective view of a main portion, FIG. 2 is a cross sectional view of the main portion depicted in FIG. 1, and FIG. 3 is a partial front view of the main portion viewed from the direct underneath of the illumination device.

As depicted in FIGS. 1 to 3, a ceiling illumination device as the illumination device of the invention has a flat circuit board 2. The circuit board 2 is arranged to be like a box case with the lower part opened as the opening, or arranged in the opening portion of the ceiling. The upper side of the circuit board 2 in FIGS. 1 and 2 is a ceiling side RS, and the lower side of the circuit board 2 in FIGS. 1 and 2 is a floor side FS which is opposite the ceiling side RS.

A plurality of LEDs 3 are fixed to the lower face of the circuit board 2 which is located in the floor side FS. More specifically, the LED 3 is formed in such manner that a point like light emitting portion 3a is encapsulated by a sealing member such as epoxy resin, glass or etc., like a molded bombshell. The LEDs 3 are arranged in a matrix state on the circuit board 2, more specifically, the lower face of the circuit board 2 in the floor side FS. Light reflecting plates are arranged on the lower face of the circuit board 2 to reflect the light emitted from the LEDs.

The LEDs as the point like light source of this embodiment are formed such that the light emitting portion is encapsulated by the sealing member 3a to be like the molded bombshell, and a light scatter means is provided in the sealing member 3b to cover the light emitting portion 3a. By thus provided light scatter means, the illumination device is formed so that the brightness of one of the plurality of LEDs is to be up to 30000 cd/m$^2$, when the brightness is defined as that the incident angle of the light emitted from the LED is zero and 350 mm apart from the LED (hereinafter referred to as "LED brightness"). In addition, the illumination device is formed so that a part or all of the light emitted from one of the LEDs 3 as the point like light source is reflected from the inner face of a receiving concave portion 7 described later of the light reflecting plate 4 to be scattered and supplied as the illumination.

Although the upper limit of the LED brightness is 30000 cd/m$^2$, 10000 cd/m$^2$ is preferable. With the above described LED brightness, the glare of the light source looked from the direct beneath can be much reduced. The lower limit of the LED brightness is 300 cd/m$^2$, 1000 cd/m$^2$ is preferable. Even if the LED brightness is low, it is applicable that the light is scatter-reflected from the light reflecting plate 4 and widely pervaded in the horizontal direction.

Meanwhile, the brightness is defined as the value measured by the glare measuring instrument when the distance from the top portion 3c of the LED 3 to the measuring portion BMa of the glare measuring instrument is 350 mm, as depicted in detail in FIG. 2.

When the sealing member 3b is formed by a transparent resin or glass, the light scatter means is formed by the sealing member 3b with the surface blast-processed, the sealing member 3b with the surface etched, or the sealing member 3b in which the material forming the sealing member 3b is mixed with a scatter material such as light scattering glass. The etching in the present invention means a process to roughen the surface of the material, namely, a surface roughening treatment. As the method of etching, it can be appropriately selected depending on the material of the sealing member 3b in the followings: cutting, grinding, ultrasonic machining, laser such as excimer laser, electrical discharging machining, wet and dry etching, electron beam, sandblast, micro blast or the like.

The sealing member 3b may be formed to a prism type or concave lens type so that a part or all of the light from the light emitting portion 3a is scattered in the lateral direction of the sealing member 3b.

The point like light source may be provided with a light flux control member to expand and emit the light from the point like light source. Preferably, the light flux control member may uniformly and smoothly expand the light from the point like light source and emit same. The light flux control member may have the shape to enable to expand the light emitted from the point like light source and emit same. For example, the light flux control member has a shape in which the bottom looks like a disk and the upper face of the upper portion looks like a partially defect sphere. In addition, the light flux control member may have a shape in which the bottom looks like a disk, the upper face of the upper portion looks like a partially defect sphere, and the end peripheral of the upper face of the upper portion has a smoothly curbed portion. Further, the light flux control member may have a shape in which the bottom looks like a disk, and the lower face of the upper portion looks like a partially defect sphere. The light flux control member may also have a shape in which the bottom looks like a disk, and the upper face of the upper portion has a concave portion with the bottom positioned in the center thereof (refer to FIG. 6). The light flux control member may also have a shape in which the bottom looks like a disk, the upper face of the upper portion has a concave portion with the bottom positioned in the center thereof, and the side portion of the upper face protrudes upward (refer to FIG. 7). The light flux control member also may have a shape in which the bottom looks like a disk, the upper face of the upper portion has a sharp concave portion with the bottom positioned in the center thereof, and the side portion of the upper face has a respective square corners (refer to FIG. 8). As an example of the above described light flux control member, LEC (Light Enhancer Cap: the product of Enplas Display Device Corporation) can be exemplified. The light flux control member may be arranged to cover the surface of the sealing member 3b. In this case, the light flux control member may have a shape in which a concave portion is provided on the lower face to fix the sealing member 3b therein.

The kind and shape of the point like light source are not specifically limited, and can be selected among the above described bombshell type LED (LED 3), surface mounted type LED or the like.

As the color of the emitted light from the point like light source, various kind of color such as red, green, blue, yellow, white or the like can be used by itself or in combination with the other.

The brightness of the point like light source can be appropriately selected, considering the scope of the invention according to the conditions.

The number of the point like light source received in single receiving concave portion 7 may be one or plural.

The receiving concave portion 7 to enclose each of the plurality of LEDs 3 is formed by the circuit board 2 and the light reflecting plate 4. The shape of the bottom of the receiving concave portion 7, formed by the circuit board 2 is quadrangle in the embodiment, however, any shape is applicable.

The receiving concave portion 7 in this embodiment is formed to be a reverse multi sided pyramid or reverse multi sided pyramid with the top thereof cut (namely, multi-sided pyramid with the top thereof cut is positioned upside down). More specifically, the receiving concave portion 7 is formed to be the reversed four-sided pyramid, or the reversed four-sided pyramid with the top thereof cut. Each of the top 6 of the peripheral walls (i.e., light reflecting plate 4) of the receiving concave portion 7 is arranged to be in the same plane. Meanwhile, the tops of the peripheral walls of the receiving concave portion 7 are preferably connected to the tops of the peripheral walls of the adjacent receiving concave portion 7.

More specifically, the light reflecting plates are arranged to position between the LEDs 3, or the light reflecting plates are arranged to place each of the LEDs in the respective receiving concave portions 7 formed to be the reversed multi-sided pyramid. Consequently, the LED 3 is wire-arranged in advance on the circuit board 2 so that the LED appear at the floor side FS of the circuit board 2 forming the bottom portion of the receiving concave portion 7.

The shape of the receiving concave portion 7 is not limited to the reversed four-sided pyramid. Other reversed multi-sided pyramid, such as the reversed three-sided pyramid, reversed five-sided pyramid, reversed six-sided pyramid may be applicable. The shape of the receiving concave portion may be appropriately selected among various kinds such as cup type, pot type, hemisphere type, semielliptical sphere with the through hole in the bottom, depending on the specification or design concept.

Suppose that the imaginary straight line 8 connects the top 3a of the LED 3 and the top 6 of the light reflecting plate 4, that the line of beam LC is expressed as the incident angle of the light emitted from the LED 3 is 0 degree, and that the angle $\alpha$ is formed by the imaginary straight line 8 and the line of beam LC. When the light reflecting plate 4 including the receiving concave portion 7 formed to be the reverse multi-sided pyramid of this embodiment is used for a general illumination, the angle $\alpha$ is preferably within the range from 30 to 110 degrees, in particular, more preferably from 45 to 90 degrees, as depicted in FIG. 2. With the above range of the angle, the light reflected from the light reflecting plate 4 can be widely reached in the horizontal direction, thus preferable. The illumination device is used for the directional illumination, the angle $\alpha$ is preferably up to 30 degrees, more preferably within the range from 15 to 30 degrees.

When the cup type receiving concave portion 7 is used, in which the flat portion between the adjacent LEDs 3 is positioned at the highest, the light emitting portion 3a of the LED is preferably positioned within the receiving concave portion 7.

The angle $\beta$ formed by the slant face of the light reflecting plate 4 and the horizontal face is preferably within the range from 20 to 70 degrees, more preferably from 40 to 50 degrees. With the above range of the angle, the light reflected from the light reflecting plate 4 can be widely reached in the horizontal direction, thus preferable.

The gap of at least 1 mm is preferably provided between the peripheral wall of the light reflecting plate 4 in the receiving concave portion 7 and the LED 3. Due to this arrangement, the heat generated from the LED 3 is dissipated, and the displacement of the circuit board 2 and the light reflecting plate 4 caused by the different coefficient of thermal expansion can be reduced.

The light reflecting plate is preferably formed by thermoplastic resin film or sheet which has fine foams or pores having an average diameter within the range from at least wavelength of the light to 50 µm inside thereof.

As the material of the thermoplastic resin film or sheet, there are exemplified as follows, for example: general purpose resin such as polyethylene, polypropylene, polystyrene, polyvinyl chloride, polychlorinated biphenyl, polyethylene terephthalate, polyvinyl alcohol, engineering plastic such as polycarbonate, polybutylene terephthalate, polyethylene naphthalate, polyamide, polyacetal, polyphenylene ether, ultrahigh molecular polyethylene, polysulfone, polyether sulfone, polyphenylene sulfide, polyallylate, polyamide-imide, polyether imide, polyether ether ketone, polyamide, polytetrafluoroethylene, liquid crystal polymer, fluorine resin, or copolymer or mixture of the above. Polyester, polyphenylene sulfide, polypropylene, or cyclopolyolephine is preferable in the above described, since they are excellent in heat resistance, impact resistance or the like.

Antioxidant, ultraviolet absorber, lubricant, pigment, enhancement or the like can be added to the thermoplastic resin. In addition, a coating layer containing the above described addition agent may be applied.

More specifically, as an example of the thermoplastic resin film or sheet, polyester based foam sheet (for example, MCPET (registered trademark) manufactured by Furukawa Electric Co. Ltd) can be used. The above described polyester based foam sheet is the sheet having a foam diameter of up to 50 μm therein in which an extruded sheet of the thermoplastic polyester is caused to impregnate carbon dioxide gas under high pressure, and then heated and foamed. In addition, cyclopolyolephine based foam sheet having a foam diameter of up to 50 μm therein can be applied.

As a preferable example of the material forming the light reflecting plate 4, there can be exemplified thermoplastic film or sheet containing filler in which a number of voids are formed on the filler functioning as the core. In this case, a porous stretched film or sheet with a number of voids formed on the filler functioning as the core is preferable, in which the film or sheet is manufactured by the processes that an un-stretched film or sheet containing fillers is formed, and then the un-stretched film or sheet is stretched.

Thickness of the light reflecting plate 4 is preferably within the range of from 150 to 2000 μm. With the thickness range of 150 to 2000 μm, the light reflecting plate has rigidity, and few light leaks to the back side of the light reflecting plate 4.

The specific gravity of the light reflecting plate 4 is preferably within the range of from 0.1 to 0.7. With the specific gravity of over 0.7, the light reflecting plate becomes transparent, and a lot of light leak to the back side of the light reflecting plate 4, thus enlarging the light loss.

The diffuse reflectivity of the visible light in the light reflecting plate 4 is preferably at least 90%. With the diffuse reflectivity of at least 90% in the light reflecting plate 4, the scattered reflection effect of the light source is improved.

Meanwhile, the diffuse reflectivity of the visible light is a ratio of the diffuse reflective light flux to the incident light flux. More specifically, the diffuse reflectivity is measured by the spectrophotometer with the wavelength of 555 nm, and is obtained as the relative value to the standard value, when the diffuse reflectivity of the white plate with fine powder of barium sulfate fixed thereon is 100%. As the spectrophotometer, UV-3100PC (the product name of Shimadzu Corporation) can be used, for example.

Figure 4:
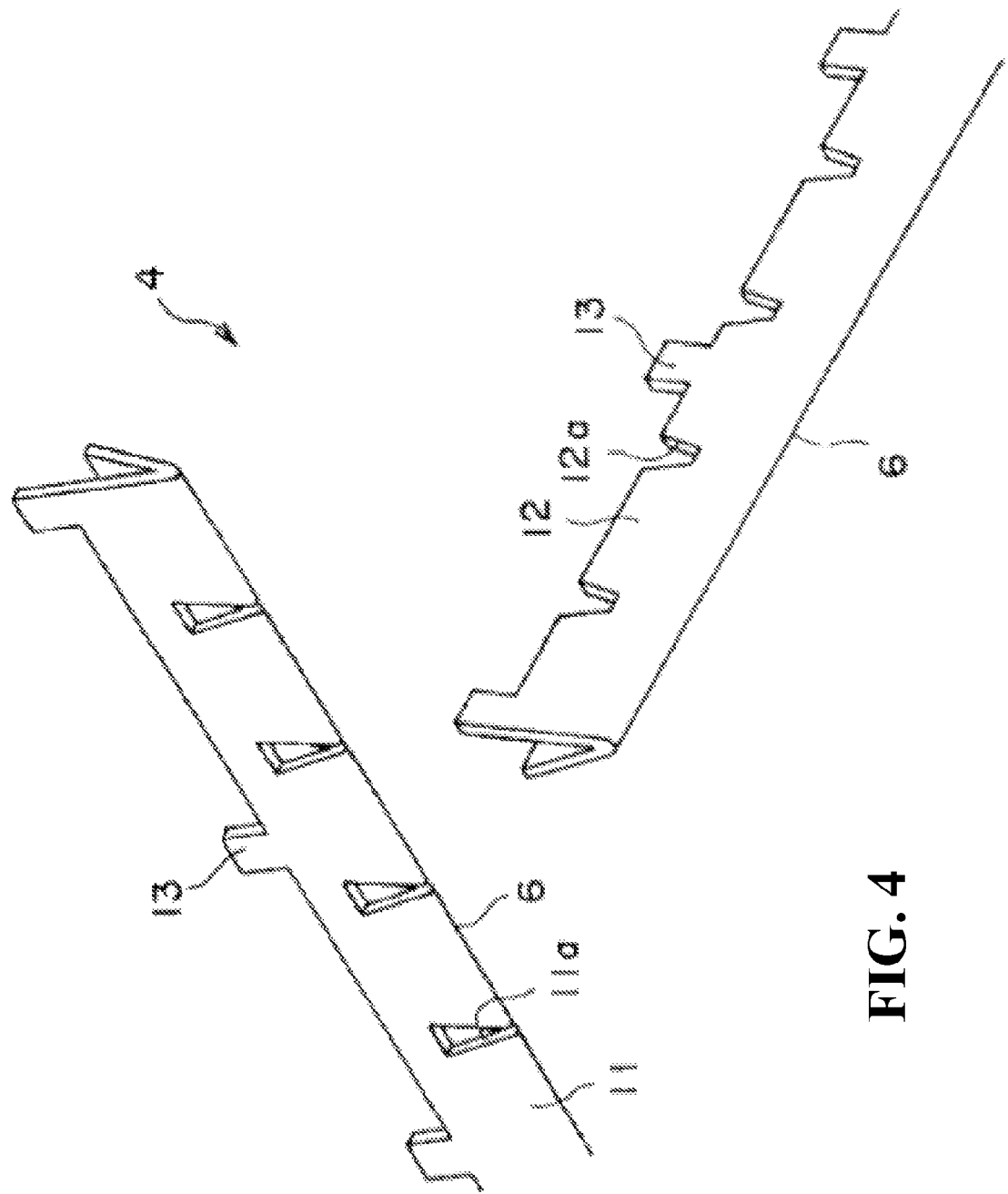
FIG. 4 is a schematic view to describe one example of the method of fabricating the light reflecting plate in FIG. 1.

The method of fabricating the light reflecting plate 4 is described with reference to FIG. 4. As depicted in FIG. 4, the film or sheet is stamped out, and then bent at the center thereof along the longitudinal direction to form a mountain like member. First concave fitting portions 11a having the depth of a half of height are formed with a specific pitch at the top 6 of the mountain like member toward the bottom so as to prepare the first mountain like member 11. In the same fashion, second concave fitting portions 12a having the depth of a half of height are formed with a specific pitch at the top 6 of the mountain like member toward the bottom so as to prepare the second mountain like member 12. The first concave fitting portions 11a and the corresponding second concave fitting portions 12a are fitted each other to form the light reflecting plate with a plurality of reverse four sided pyramid type of the receiving concave portions 7. Furthermore, engaging members protruding from the bottom are formed with a prescribed pitch at the bottom portion of the respective first and second mountain like member 11, 12. The engaging member may be inserted into the slit (not shown) formed in the circuit board 2 and fixed thereto. Of course, the film or sheet may be pressed like a food tray to integrally form the light reflecting plate. In this case, the tops 6 of the peripheral walls of each of the receiving concave portion 7 are connected each other with the tops 6 of the peripheral walls of the adjacent receiving concave portion, thus integrally formed.

EXAMPLE

The present invention is more specifically described by examples. The invention is not limited by the examples.

Example 1

The ceiling illumination device as depicted in FIGS. 1 to 3 was manufactured. Since the illumination device was for the ceiling illumination device, the circuit board 2 was positioned to the ceiling side RS and arranged horizontally. A plurality of point like light sources 3 were arranged on the lower face of the circuit board 2 in such manner that the point like light sources 3a faced downward and were arranged at equal interval in both of the lengthwise direction and the lateral direction in a matrix state. Then, the light reflecting plates 4 were arranged between the point like light sources in such manner as filling the space.

The top 6 of the light reflecting plate 4 forming the walls of the reversed four sided pyramid of the receiving concave portion 7 were continuously connected in both lengthwise direction and the lateral direction. The point like light source was arranged on the circuit board 2 forming the bottom portion of the receiving concave portion 7.

The circuit board 2 was a flat plate having a lengthwise size of 620 mm, and a lateral size of 720 mm. A total number of 2576 point like light sources was used in such fashion that 46 point like light source were arranged in lengthwise direction and 56 point like light sources were arranged in lateral direction with the pitch of 12.7 mm in the respective lengthwise direction and lateral direction in a matrix shape.

As the point like light source 3, the white LED manufactured by Nichia Corporation (product No. NSPW510CS, brightness 4900 mcd, directivity 50 degrees, forward current 20 mA, forward voltage 3.6V) was used. The sealing member 3b was a bombshell type and made of epoxy resin. The whole surface of the sealing member was etched like a frosted glass. One LED with the whole surface of the sealing member etched like the frosted glass was turned on and the brightness was measured at the point which is apart L of 350 mm from the top 3c of the sealing member by the brightness photometer. The measured brightness was 15000 cd/m$^2$. The brightness photometer manufactured by TOPCON Corporation (equipment name is BM7) was used. As depicted in FIG. 2, the brightness was measured under the condition that the distance from the top 3c of the LED 3 to the measuring portion BMa of the brightness photometer BM is 350 mm and the angle of the spot was 0.2 degrees (measuring method is the same as in the comparative test described later).

The etching the whole surface of the sealing member as the frosted glass was carried out using the sand blast.

As the light reflecting plate 4, polyethylene terephthalate foam body (product name of MCPET, manufactured by Furukawa Electric Co. Ltd) was used, which had an average foam diameter of 10 μm, thickness of 1000 μm, specific gravity of 0.325, diffuse reflectivity of visible light of 97%.

The receiving concave portion 7 was the reversed four sided pyramid in which the respective tops 6 of the peripheral walls were continuously connected. The bottom portion of the receiving concave portion 7 was formed by the circuit board 2 into which LED was to be inserted. The lengthwise size of the lower opening portion of the receiving concave portion was 12.7 mm, and the lateral size thereof was 12.7 mm, while the respective lengthwise size and lateral size of the bottom portion was 7 mm, and the depth size thereof was 17 mm.

(Comparative Test 1)

The same ceiling illumination device (not shown) as Example 1 except the following was formed, in which the light reflecting plate 4 was not used, and no etching like the frost glass was made on the whole surface of the bombshell type sealing member of the LED 3. One LED of the comparative test 1 was turned on and the brightness was measured at the point which was apart of 350 mm from the top of the sealing member by the brightness photometer. The measured brightness was 72000 cd/m$^2$.

(Comparative Test 2).

An Embedded type illumination device with 2 Straight tubes fluorescent light (Hf exclusive use illumination device manufactured by Mitsubishi Electric Osram Ltd, lamp: lupica line N FHF32EX-N three wavelengths type day white) was installed on the ceiling.

(Comparative Test 3)

A Fuji type illumination device with 2 Straight tubes fluorescent light (FA42038F manufactured by Matsushita Electric Industrial Co, Ltd, lamp: high light S FLR40S.W/M white rapid start) was installed on the ceiling.

(Comparative Test 4)

The same ceiling illumination device as Example 1 except that the light reflecting plate 4 was not used was formed.

Example 1 and the Comparative tests 1 to 4 were evaluated by the following process.

<Comparison of the Glare>

The illumination devices of Example 1, the comparative tests 1 and 2 were turned on, and the brightness was measured at the point which was apart L of 350 mm from the top 3a of the light source by the brightness photometer. The measured brightness in Example 1 was 15000 cd/m$^2$ whereas the measured brightness in the comparative test 1 was 72000 cd/m$^2$, and the measured brightness in the comparative test 2 was 11000 cd/m$^2$.

As is evident from the evaluated result, the brightness in Example 1 was substantially the same as that of the generally used straight tube fluorescent light (i.e., comparative test 2). Furthermore, when the illumination device was looked straight up from 1 m direct beneath, no glare or discomfort was felt in Example 1 (the same as the generally used fluorescent light). On the contrary, the glare and discomfort were unbearable in the comparative test 1.

<Comparison of Illumination>

The ceiling illumination devices of Example 1, comparative tests 1, 3 and 4 were separately installed on the ceiling which was located 2 mm above the desk (A). Another desk (B) was placed in lateral direction 2 m apart from the desk (A). For the comparative test 3, the desk (b) was positioned 2 m apart from the desk (A) in the vertical direction to the longitudinal direction of the straight tube fluorescent light of the ceiling illumination device. The measured results of the illumination at the respective desk were the followings. In order to measure the illumination, general AA class illuminometer (type 51002) manufactured by Yokogawa M&C co. Ltd was used.

The results of the measured illumination on the desk (A) were 552 lux (lx) for Example 1, 615 lux (lx) for the comparative test 1, 567 lux (lx) for the comparative test 3, and 413 lux (lx) for the comparative test 4. The results of the measured illumination on the desk (B) were 324 lux (lx) for Example 1, 43 lux (lx) for the comparative test 1, 364 lux (lx) for the comparative test 3, and 240 lux (lx) for the comparative test 4.

As is evident from the above described evaluation, a desired illumination can be obtained on the desk (A) directly beneath the light source and the desk (B) 2 m apart horizontally in Example 1, which is substantially the same as that of the generally used straight tube fluorescent light (i.e., the comparative test 3). On the contrary, although illumination is good on the desk (A), it is dark on the desk (B) which is 2 m apart horizontally in the comparative test 1. Furthermore, it is dark both on the desk (A) and the desk (B) in the comparative test 4.

By the way, the lower limit of the illumination in the standard illumination of the computer room of the school (indoor) is 300 lux (lx), according to the standard illumination in Japanese Industrial Standards (JIS Z 9110, attached table 3-1).

Incidentally, a plurality of point like light sources LEDs arranged in a matrix state on the flat circuit board 2 are used in the embodiment and example as the plurality of point like light sources. However, each of the point like light source is modularized to be the light source module, and a plurality of the light source modules may be arranged in a matrix state as the plurality of point like light sources. Furthermore, a plurality of point like light sources are modularized to be the light source module, and a plurality of the light source modules may be arranged in a matrix state.

Figure 5:
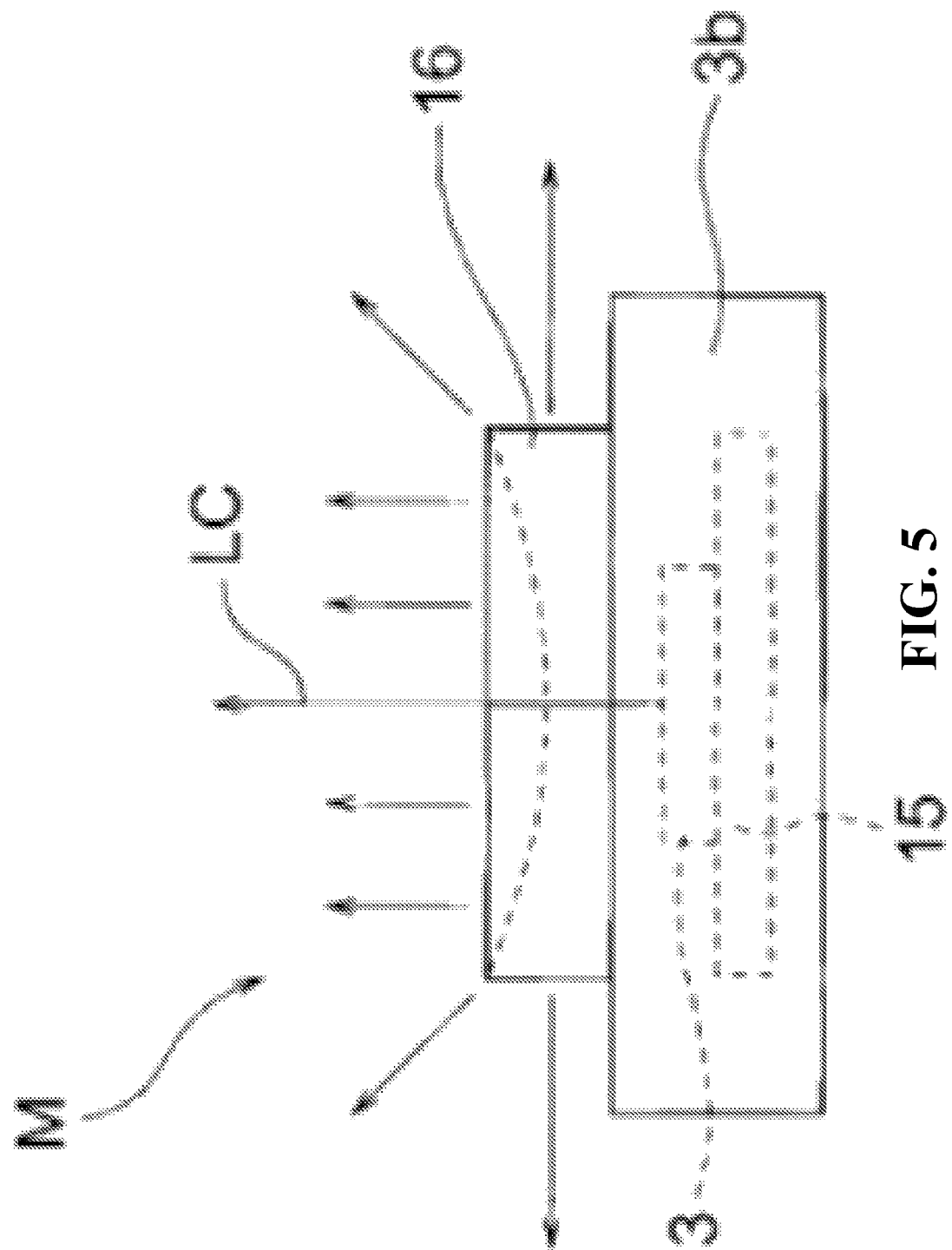
FIG. 5 is an enlarged schematic view to show one example of the main portion of the light source module.

FIG. 5 depicts one example of the modularized point like light source. In the light source module M in which one point like light source is modularized, the board (circuit board) 15 mounting the LED 3 is sealed as a whole by the sealing member 3b to be plate like in cross section. The light flux control member 16 is arranged on the surface of the sealing member through which the light of the LED 3 is emitted (i.e., the traveling direction of the light LC as depicted in FIG. 5). The light flux control member 16 scatters the light emitted from the LED. The light flux control member preferably uniformly and smoothly scatters the light emitted from the LED and emits same as depicted in FIG. 5.

The light flux control member may have the shape to enable to expand the light emitted from the LED 3 and emit same. For example, the light flux control member has a shape in which the bottom looks like a click and the upper face of the upper portion looks like a partially defect sphere. In addition, the light flux control member may have a shape in which the bottom looks like a disk, the upper face of the upper portion looks like a partially defect sphere, and the end peripheral of the upper face of the upper portion has a smoothly curbed portion. Further, the light flux control member may have a shape in which the bottom looks like a disk, and the lower face of the upper portion looks like a partially defect sphere. The light flux control member may also have a shape in which the bottom looks like a disk, and the upper face of the upper portion has a concave portion with the bottom positioned in the center thereof (refer to FIG. 6). The light flux control member may also have a shape in which the bottom looks like a disk, the upper face of the upper portion has a concave portion with the bottom positioned in the center thereof, and the side portion of the upper face protrudes upward (refer to FIG. 7). The light flux control member also may have a shape in which the bottom looks like a disk, the upper face of the upper portion has a sharp concave portion with the bottom positioned in the center thereof, and the side portion of the upper face has a respective square corners (refer to FIG. 8).

In case that the light source module M is used as a part of the plurality of point like light sources, it is essential that the shape and size of the circuit board 2 forming the bottom of the receiving concave portion 7 is to be set so that the light flux control member 16 can be inserted and mounted.

The surface of the light flux control member 16 may be etched to be like a frost glass to allow an additional function of the light scattering.

As the material of the light flux control member 16, such transparent resin material as PMMA (polymethylmethacrylate), PC (polycarbonate), EP (epoxy), or transparent glass are preferable.

As the light source module M, specifically, shining eye (L) (product name of Koha Co. Ltd) is exemplified.

The module is a circuit component assembling wired circuit elements, and manufactured according to the standardized size, thus having the standardized plug in terminal or the terminal enabling to be soldered.

Figure 6:
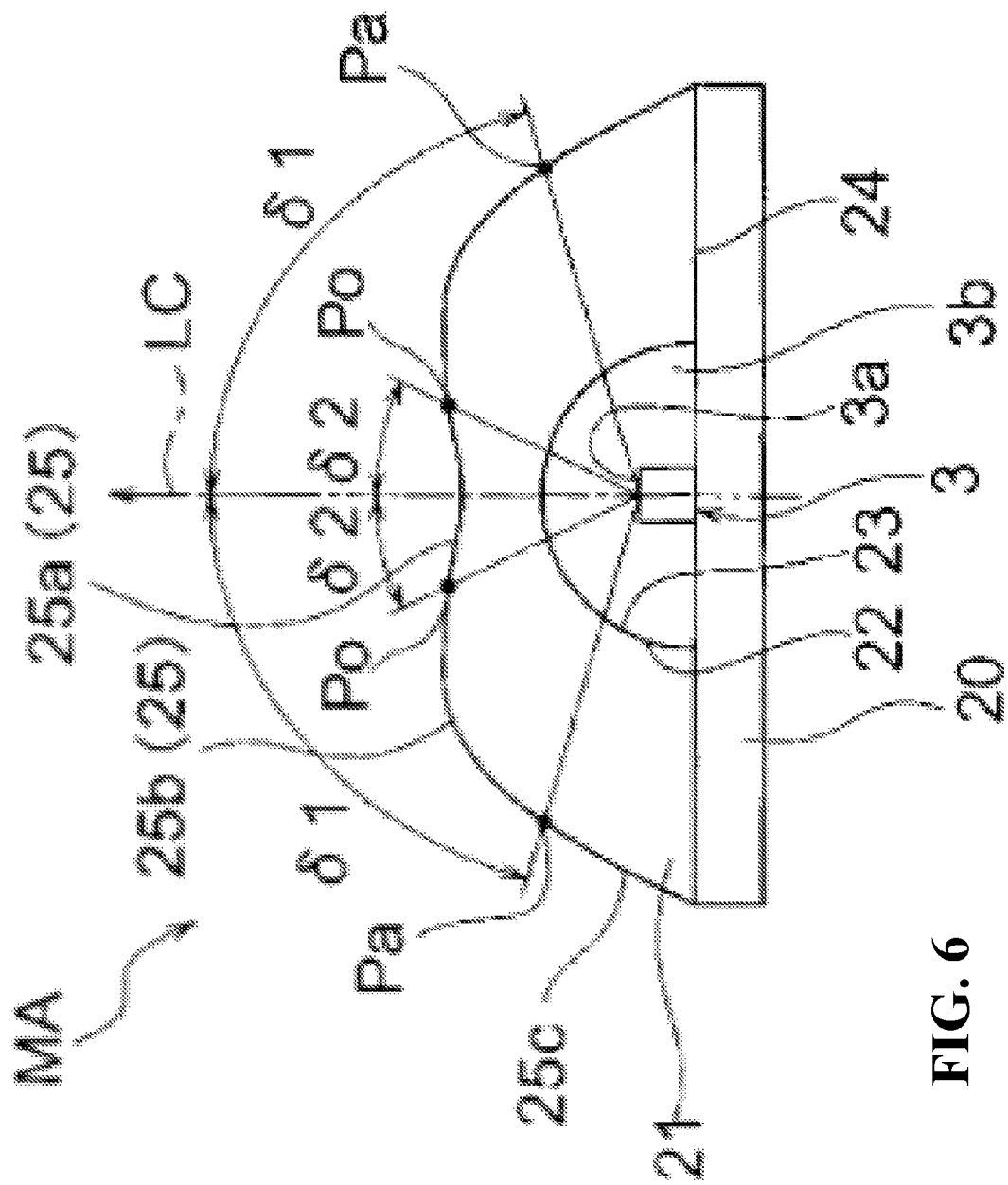
FIG. 6 is an enlarged schematic cross sectional view to show other example of the main portion of the light source module.
Figure 7:
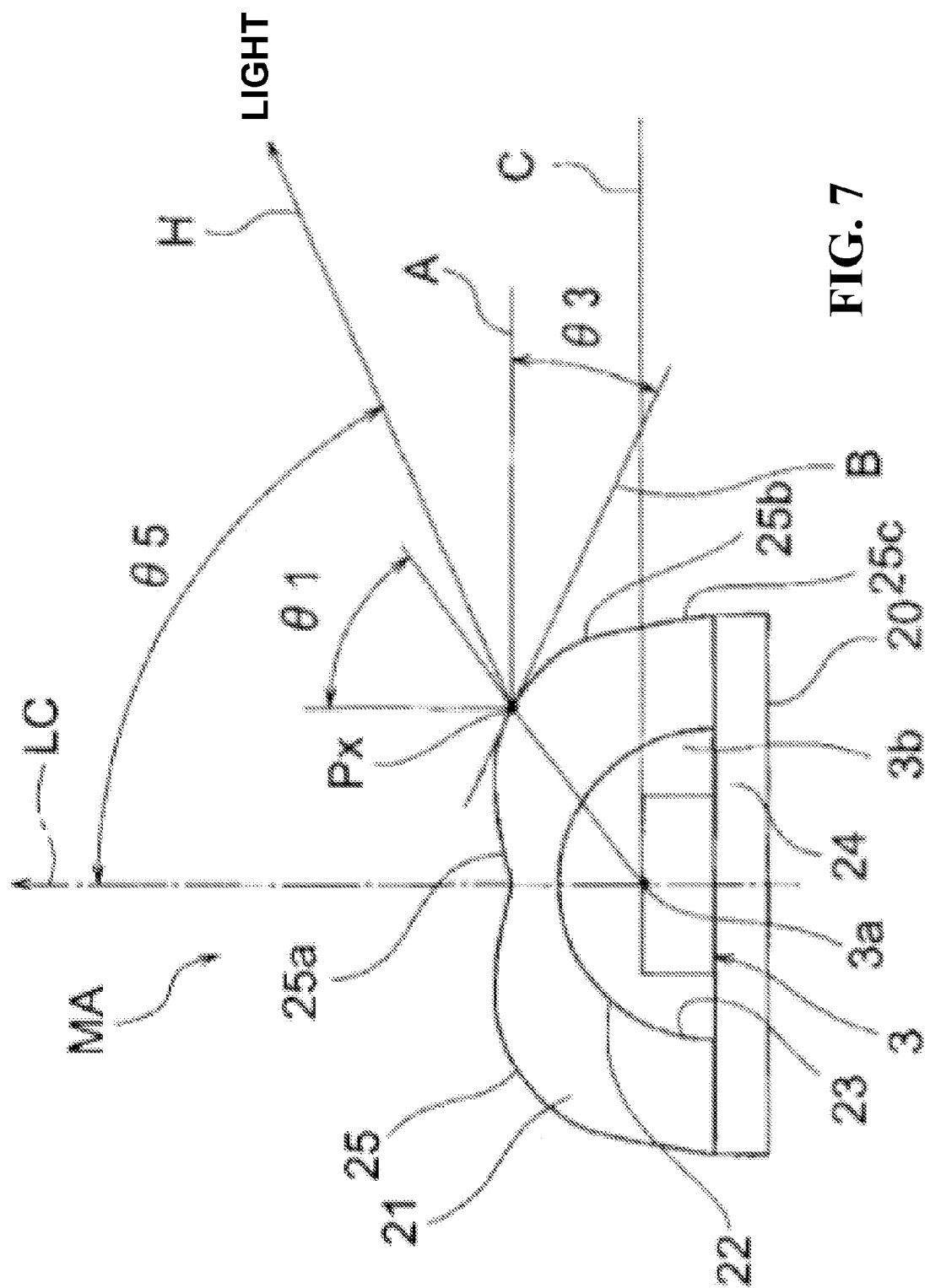
FIG. 7 is the similar view of FIG. 6 to explain the light flux control member depicted in FIG. 6.
Figure 8:
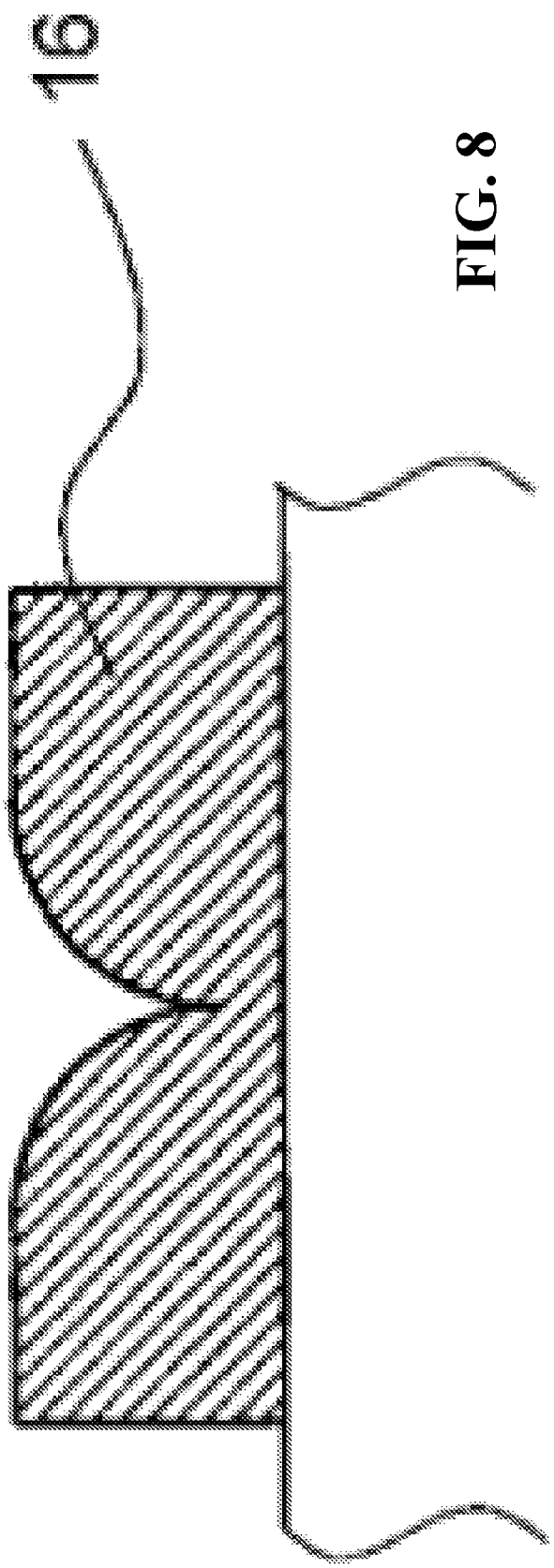
FIG. 8 is a schematic cross sectional view to show a modified example of the light flux control member in the light source module.

Other light source modules MA as depicted in FIGS. 6 and 7 can be applied. In the light source module MA, the light generated from the light generating portion 3a as the point like light source of the LED 3 mounted on the board (circuit board) 20 is emitted through the light flux control member 21. Alternatively, in the light source module MA, the light generated from the light generating portion 3a as the point like light source of the LED 3 mounted on the board (circuit board) 20 is emitted through the sealing member 3b and the light flux control member 21 in this order.

The sealing member 3b is formed to hemispherically cover the light generating portion 3a of the LED 3 mounted on the board 20.

As the material of the light flux control member 16, such transparent resin material as PMMA (polymethylmethacrylate), PC (polycarbonate), EP (epoxy), or transparent glass are preferable.

The light flux control member 21 has a circular shape in horizontal plane. As depicted in FIG. 6, which is a cross sectional view cut vertically, the light flux control member 21 has a concave portion 23 inside thereof (the lower side in FIG. 6) so as to closely cover the light emitting face 22 of the LED 3. The concave portion 23 is formed at the inner side of the light flux control member 21 (the lower side in FIG. 6) to be like the hemispherical in the center thereof. The hemispherical shape of the concave portion 23 of the light flux control member 21 corresponds to the shape of the light emitting face 22 of the LED so that the concave portion 23 is closely fit to the light emitting face 22. The lower side of the light flux control member 21, which has a flat face portion 24, is adhesively fixed to the board 20 mounting the LED 3. Thus, the concave portion 23 of the light flux control member 21 is adhesively fixed to the light emitting face 22 of the LED 3.

The light flux control member 21 has a light control emitting face 25 at the outer surface thereof. The light control emitting face 25 has the first emitting face 25a, which is located at the prescribed region with the light axis LC as its center, and the second emitting face 25b which is continuously formed at the peripheral of the first emitting face 25a. The first emitting face 25a has a smoothly and downwardly protruding curbed shape (i.e., convex downward). In other words, an upper part of the sphere is cut and the concave shape is formed in the center portion thereof. The second emitting face 25b is formed continuously to the first emitting face 25a, which has a curbed shape of smooth and convex. The second emitting face 25b has a hollow disk shape in the horizontal plane which surrounds the first emitting face. The first emitting face 25a is smoothly connected to the second emitting face 25b. The connecting portion of the first emitting face and the second emitting face forms the point of inflexion Po.

The third emitting face 25c is formed at the outer peripheral side of the second emitting face 25b forming the light control emitting face 25, which connects the second emitting face 25b to the flat face portion 24. Although the third emitting face 25c is shown to have a straight slant face in FIG. 6, the shape of the third emitting face is not limited to the above described feature. The shape of the third emitting face may be a curved face as far as it does not prevent the wide and smooth emitting of the light flux control member 21. Here, the angle formed between the light axis LC and the line connecting the light source to the connecting point of the emitting faces 25c and 25c is represented by $\delta 1$. The angle formed between the light axis LC and the line connecting the light source to the point of inflexion Po is represented by $\delta 2$.

Here, the light control emitting face 25 of the light flux control member 21 is described in detail with reference to FIG. 7.

The horizontal face perpendicular to the light axis LC of the LED 3 is considered as the reference plane C. The position where the light H emitted from the LED 3 and propagated in the light flux control member 21 emits from the light control emitting face 25 is considered as the position Px (i.e., the intersection of the light control emitting face 25 and the light H). The line drawn parallel to the reference plane C from the position Px is represented by the line A. The angle formed between the light incident in the light flux control member 21 and reaching the light control emitting face 25, and the line parallel to the light axis LC and passing the point in which the above described light reaches at the light control emitting face 25 is represented by the angle $\theta 1$. The angle formed between the tangent line B in the contour of the light control emitting face 25 at the position Px, and the line A is referred to as the angle $\theta 3$. Where the position Px is the position where the light H from the LED 3 emits the light control emitting face 25. The angle of the emission of the light H from the LED 3 at the light control emitting face 25, which propagates in the light flux control member 21 and emits from the light control emitting face 25, is referred to as the angle $\theta 5$ (i.e., the angle formed between the light axis LC and the light H emitting from the light control emitting face 25).

The light control emitting face 25 depicted in FIG. 7 is formed to satisfy the relation between $\theta 1$ and $\theta 5$ to be $(\theta 5/\theta 1) > 1$, within the prescribed region including the angle region (excluding the light in the vicinity of the normal line (the light axis LC in FIG. 7) between the direction to which at least maximum strength light is emitted from the LED 3 and the direction to which one half of strength light of the maximum strength light is emitted. Where the direction to which at least maximum strength light is emitted means the direction along the light axis LC, as well as the direction along the normal line of the reference plane C, and the prescribed angle region is within the angle region of $\theta 1 < \delta 1$. The light control emitting face is formed to be the shape so that the value of $\theta 5/\theta 1$ is gradually reduced as the $\theta 1$ increases.

When the coefficient of the diffusion degree of the light flux control member 21 is represented by $\alpha$, $\theta 5$ is expressed within the region of $\theta 1 < \delta 1$ by $((1+((\delta 1-\theta 1) \times \alpha)/\delta 1)) \times \theta 1$, ($\theta 1 < \delta 1$). Furthermore, $\theta 3$ is expressed within the region of $\theta 1 < \delta 1$ by $\tan^{-1}((\sin \theta 5 - n \cdot \sin \theta 1)/(\cos \theta 5 - n \cdot \cos \theta 1))$, (n is the refraction index of the light flux control member). The vicinity of the above described normal line (i.e., light axis LC in FIG. 7) means that $\theta 1$ is preferably within a range of ±5 degrees, for example.

Thus obtained $\theta 3$ is gradually reduced, as $\theta 1$ increases from the vicinity of light axis LC until $\theta 1 = \delta 2$. In the region of $\theta 1 > \delta 2$, $\theta 3$ gradually increases, as $\theta 1$ increases. Then, when $\theta 1$ becomes to coincide with $\delta 1$, it satisfies $\theta 3 = \theta 1$.

The function of the light control emitting face 25 in the light flux control member 21 is described. As depicted in FIG. 7, the light H from LED 3 is propagated inside of the light flux control member 21, and then emits from the light control emitting face 25 to the outside (in the air) according to Snell's law. In this case, the light flux of the LED emitted from the light flux control member 21 is not partially emitted at the direct overhead of the LED 3, but uniformly and smoothly expanded and emitted into the irradiating region, comparing with the light flux emitted from the light flux control member simply formed in hemisphere shape.

More specifically, preferably, the light source module MA may be formed such that the light generated from the light generating portion 3a as the point like light source is emitted through the light flux control member 21. Alternatively, the light generated from the light generating portion 3a as the point like light source is emitted through the sealing member 3b and the light flux control member 21 in this order. The light flux control member 21 may includes the light incident face (the concave face of the concave portion 23) into which the light from the light generating portion 3a of the point like light source or the light from the light generating portion 3a sealed by the sealing member 3b enters, and light control emitting face 25 to control the light emission from the light generating portion 3a. The light control emitting face 25 may emit the light ranging between the direction to which at least maximum strength light is emitted from the LED 3 and the direction to which one half of strength light of the maximum strength light is emitted. The light control emitting face 25 may be formed to satisfy the relation between θ1 and θ5 to be (θ5/θ1)>1 excluding the light in the vicinity of the reference plane. Where the angle formed between the light reaching the light control emitting face 25, and the line parallel to the light axis LC of the light source module MA and passing the reaching point is represented by the angle θ1, and the angle of the emission of the light from the light control emitting face 25 is referred to as the angle θ5. Furthermore, the light control emitting face may be formed to be the shape in such fashion that the value of θ5/θ1 is gradually reduced as the θ1 increases.

As the light source module MA, specifically, the module in which LEC (Light Enhancer Cap: the product of Enplas Display Device Corporation) is used as the light flux control member 21 can be exemplified.

The present invention is not limited to the above described embodiments, and it is possible to be variously modified as required.

What is claimed is:

1. An illumination device comprising:
   a receiving concave portion comprising a light reflecting plate or a combination of the light reflecting plate and a circuit board; and
   a point like light source, arranged in the receiving concave portion,
   wherein the point like light source emits a light with a brightness up to 30000 candelas per square meter (cd/m$^2$), wherein the brightness is defined as a value measured by a glare measuring instrument when a distance from a top portion of the illumination device to a measuring portion of the glare measuring instrument is 350 millimeters (mm) and an incident angle of the light on the glare measuring instrument is zero,
   wherein a part or all of the light emitted from the point like light source is scatter-reflected from an inner face of peripheral walls of the receiving concave portion and supplied as an illumination, and
   wherein the receiving concave portion is formed as a reverse multi sided pyramid or a reverse multi sided pyramid with a top thereof removed.

2. The illumination device according to claim 1, wherein the point like light source comprises a light emitting diode (LED) with a point like light generating portion sealed by a sealing member.

3. The illumination device according to claim 2, wherein the tops of peripheral walls of the receiving concave portion are configured to connect to adjacent tops of the peripheral walls of adjacent receiving concave portions.

4. The illumination device according to claim 2, wherein a diffuse reflectivity of the light in the light reflecting plate is at least 90%.

5. The illumination device according to claim 2, wherein the light reflecting plate comprises a thermoplastic resin film or a thermoplastic sheet which has fine foams or pores having an average diameter within a range from at least a wavelength of the light to 50 micrometers (μm) inside thereof.

6. The illumination device according to claim 2, further comprising a light flux control member arranged to cover the light sealing member, wherein the light flux control member is configured to scatter and emit the light from the point like light source.

7. The illumination device according to claim 6, wherein the LED is formed such that the light is emitted through through the sealing member and the light flux control member in this order,
   wherein the light flux control member includes a light incident face into which the light enters the light flux control member, and a light control emitting face configured to control the light emission,
   wherein a reference plane is established as a horizontal face perpendicular to a light axis of the LED,
   wherein an angle formed between the light entering the light flux control member and reaching the light control emitting face and a line parallel to the reference plane and passing through a reaching point is represented by angle θ1,
   wherein an angle of the emission of the light from the light control emitting face is represented by angle θ5,
   wherein the light control emitting face is formed to satisfy a relation between θ1 and θ5 to be (θ5/θ1)>1 excluding the light in a vicinity of the reference plane, and
   wherein the light control emitting face is formed in a shape so that a value of θ5/θ1 is gradually reduced as the θ1 increases.

8. The illumination device according to claim 2, wherein the sealing member comprises a light diffusion means.

9. The illumination device according to claim 8, wherein the light diffusing means has a shape of a bombshell, a prism, or a concave lens.

10. The illumination device according to claim 8, further comprising a prism or a concave lens type.

11. The illumination device according to claim 8, further comprising a light flux control member arranged to cover the light sealing member, wherein the light flux control member is configured to scatter and emit the light from the point like light source.

12. The illumination device according to claim 8, wherein the tops of peripheral walls of the receiving concave portion are configured to connect to adjacent tops of the peripheral walls of adjacent receiving concave portions.

13. The illumination device according to claim 1, wherein the point like light source is equipped with a light flux control member configured to scatter and emit the light from the point like light source.

14. The illumination device according to claim 13, wherein a diffuse reflectivity of the light in the light reflecting plate is at least 90%.

15. The illumination device according to claim 13, wherein the light reflecting plate comprises a thermoplastic resin film or a thermoplastic sheet which has fine foams or pores having an average diameter within a range from at least a wavelength of the light to 50 micrometers (μm) inside thereof.

16. The illumination device according to claim 1, wherein the point like light source comprises a light source module including a LED mounted on a board sealed by a sealing member, and a light flux control member to scatter and emit a light emitted from the LED, arranged on a surface of the sealing member through which a light axis emitted from the LED is positioned.

17. The illumination device according to claim 1, wherein the tops of peripheral walls of the receiving concave portion are configured to connect to adjacent tops of the peripheral walls of adjacent receiving concave portions.

18. The illumination device according to claim 1, wherein a diffuse reflectivity of the light in the light reflecting plate is at least 90%.

19. The illumination device according to claim 1, wherein the light reflecting plate comprises a thermoplastic resin film or a thermoplastic sheet which has fine foams or pores having an average diameter within a range from at least a wavelength of the light to 50 micrometers (μm) inside thereof.

20. The illumination device according to claim 19, wherein the thermoplastic film or thermoplastic sheet comprises a thermoplastic polyester foam having a thickness of within a range of from 150 to 2000 micrometers (μm), and a specific gravity of within a range of from 0.1 to 0.7.

* * * * *